United States Patent
Echizenya et al.

(10) Patent No.: US 8,347,564 B2
(45) Date of Patent: Jan. 8, 2013

(54) SOLAR CELL MODULE

(75) Inventors: Daisuke Echizenya, Tokyo (JP); Hiroo Sakamoto, Tokyo (JP); Keiichiro Utsunomiya, Tokyo (JP); Hiromichi Aoki, Tokyo (JP)

(73) Assignee: Mitsubishi Electric Corporation, Chiyoda-Ku, Tokyo (JP)

( * ) Notice: Subject to any disclaimer, the term of this patent is extended or adjusted under 35 U.S.C. 154(b) by 169 days.

(21) Appl. No.: 12/597,298

(22) PCT Filed: Apr. 24, 2007

(86) PCT No.: PCT/JP2007/058852
§ 371 (c)(1),
(2), (4) Date: Oct. 23, 2009

(87) PCT Pub. No.: WO2008/136095
PCT Pub. Date: Nov. 13, 2008

(65) Prior Publication Data
US 2010/0132761 A1 Jun. 3, 2010

(51) Int. Cl.
*E04D 13/18* (2006.01)
*E04H 14/00* (2006.01)
*H02N 6/00* (2006.01)
*H01L 31/042* (2006.01)

(52) U.S. Cl. ...................................... 52/173.3; 136/244
(58) Field of Classification Search ................. 52/173.3, 52/173.1, 1, 518, 554
See application file for complete search history.

(56) References Cited

U.S. PATENT DOCUMENTS

| | | | | |
|---|---|---|---|---|
| 3,589,084 A * | 6/1971 | Reed, III | ............................ | 52/64 |
| 4,419,530 A * | 12/1983 | Nath | .............................. | 136/251 |
| 4,674,244 A * | 6/1987 | Francovitch | ................. | 52/173.3 |
| 4,836,861 A * | 6/1989 | Peltzer et al. | .................. | 136/246 |
| 4,888,061 A | 12/1989 | Wenz | | |
| 5,134,827 A * | 8/1992 | Hartman | ....................... | 52/584.1 |
| 5,164,020 A * | 11/1992 | Wagner et al. | ................ | 136/251 |
| 5,316,592 A * | 5/1994 | Dinwoodie | .................... | 136/244 |
| 5,555,683 A * | 9/1996 | Schroeder | ....................... | 52/200 |
| 5,715,636 A * | 2/1998 | Taylor | ............................. | 52/308 |

(Continued)

FOREIGN PATENT DOCUMENTS

DE  689 09 734  4/1994

(Continued)

OTHER PUBLICATIONS

International Search Report (PCT/ISA/210) dated Jul. 9, 2007.

(Continued)

*Primary Examiner* — Mark Wendell
*Assistant Examiner* — Keith Minter
(74) *Attorney, Agent, or Firm* — Buchanan Ingersoll & Rooney PC

(57) ABSTRACT

A solar cell module includes a plate-shaped solar panel including a plurality of solar cells arranged on same plane; a plate-shaped cell protection member that covers the plural solar cells that are arranged on the same plane; and a surface protection member that is bonded onto a top surface of the cell protection member; an outer frame that supports a circumference of the solar panel; and a brace having rigidity against bending and that supports a center area of a back surface of the solar panel in such a manner that both ends of the brace are joined to each of two opposed positions of the outer frame. An initial tension is provided to the brace.

7 Claims, 5 Drawing Sheets

U.S. PATENT DOCUMENTS

| | | | |
|---|---|---|---|
| 5,994,641 A * | 11/1999 | Kardauskas | 136/246 |
| 6,111,189 A * | 8/2000 | Garvison et al. | 136/244 |
| 6,242,685 B1 * | 6/2001 | Mizukami et al. | 136/244 |
| 6,407,329 B1 | 6/2002 | Iino et al. | |
| 6,410,843 B1 * | 6/2002 | Kishi et al. | 136/246 |
| 6,617,507 B2 * | 9/2003 | Mapes et al. | 136/251 |
| 6,851,227 B1 * | 2/2005 | Schildge, Jr. | 52/66 |
| 6,966,184 B2 * | 11/2005 | Toyomura et al. | 60/641.8 |
| RE38,988 E * | 2/2006 | Dinwoodie | 136/251 |
| 7,102,074 B2 * | 9/2006 | Yen et al. | 136/244 |
| 2001/0008143 A1 | 7/2001 | Sasaoka et al. | |
| 2001/0011552 A1 * | 8/2001 | Morizane et al. | 136/251 |
| 2001/0020486 A1 * | 9/2001 | Tsuge | 136/251 |
| 2004/0040248 A1 * | 3/2004 | Vilnes | 52/653.1 |
| 2004/0118446 A1 * | 6/2004 | Toyomura | 136/244 |
| 2005/0072060 A1 * | 4/2005 | Moncho et al. | 52/79.1 |
| 2005/0103376 A1 | 5/2005 | Matsushita et al. | |
| 2005/0126622 A1 | 6/2005 | Mukai et al. | |

FOREIGN PATENT DOCUMENTS

| | | |
|---|---|---|
| DE | 198 11 399 | 9/1999 |
| DE | 203 10 760 | 11/2004 |
| DE | 699 32 098 | 10/2006 |
| JP | 62-011100 | 1/1987 |
| JP | 9-119202 A | 5/1997 |
| JP | 10-252214 | 9/1998 |
| JP | 10-294485 A | 11/1998 |
| JP | 10-339007 A | 12/1998 |
| JP | 11-121781 A | 4/1999 |
| JP | 2000-101123 A | 4/2000 |
| JP | 2003-31833 A | 1/2003 |
| JP | 2003-105940 A | 4/2003 |
| JP | 2003-229593 A | 8/2003 |
| JP | 2004-006625 | 1/2004 |
| JP | 2004-6625 A | 1/2004 |
| JP | 2004-146765 A | 5/2004 |
| JP | 2004-303606 | 10/2004 |
| JP | 2004-303606 A | 10/2004 |
| JP | 2007-009590 | 1/2007 |

OTHER PUBLICATIONS

Office Action dated Mar. 31, 2011, issued in corresponding German Patent Application No. 11 2007 003 472.6-33, and an English Translation thereof.

Japanese Notice of Rejection mailed Jan. 10, 2012 in corresponding Japanese Application No. 2009-512827, and a partial translation thereof (6 pages).

Translated pp. 178-179 of "Material Mechanics in Mechanical Science" by Michiya Kishlda, published by Yokendo, 1998.

Notice of Rejection dated Apr. 17, 2012 issued in JP 2009-512827 with partial English translation.

* cited by examiner

SOLAR CELL MODULE

TECHNICAL FIELD

The present invention relates to a solar cell module, and more particularly, to a supporting structure of a solar panel that is provided to the solar cell module.

BACKGROUND ART

A conventional solar cell module includes a plurality of solar cells that is arranged in the form of a flat plate. The solar cells are coated with a cell protection member that is made of flexible resin, such as EVA (ethylene-vinyl acetate copolymer). A surface protection member that is made of, for example, tempered glass, is bonded onto the top surface of the cell protection member. By virtue of such a structure, the solar cell module has the structural strength required as a building material.

Solar cell modules that have more structural strength than the above-described conventional solar cell module are known in the art. There has been known a solar cell module in which a solar panel, a heat insulator arranged on the back surface of the solar panel, and a metal plate arranged on the back surface of the heat insulator are stacked in layers via adhesive layers (see, for example, Patent document 1).

Patent document 1: Japanese Patent Application Laid-open No. H09-119202 (page 4, FIG. 1)

DISCLOSURE OF INVENTION

Problem to be Solved by the Invention

However, in any of the above-described conventional solar cell modules, the power generation efficiency generally degrades after the solar cell module is installed outdoors, for example, on a roof of a house, in comparison with the power generation efficiency before the installation.

The present invention has been achieved to solve the above problem in the conventional technology and it is an object of the present invention to provide a highly reliable solar cell module in which the power generation efficiency does not degrade after it is installed outdoors.

Means for Solving Problem

To solve the above problems and to achieve the above objects, according to an aspect of the present invention, there is provided a solar cell module that includes a plate-shaped solar panel including a plurality of solar cells arranged on same plane; a plate-shaped cell protection member that covers the plural solar cells that are arranged on the same plane; and a surface protection member that is bonded onto a top surface of the cell protection member; an outer frame that supports a circumference of the solar panel; and a brace that supports a center area of a back surface of the solar panel in such a manner that both ends of the brace are joined to each of two opposed positions of the outer frame. An initial tension is provided to the brace.

According to another aspect of the present invention, there is provided a solar cell module that includes a plate-shaped solar panel including a plurality of solar cells arranged on same plane; a plate-shaped cell protection member that covers the plural solar cells that are arranged on the same plane; a surface protection member that is bonded onto a top surface of the cell protection member; and a back-surface plate that is bonded onto a back surface of the cell protection member; and an outer frame that supports a circumference of the solar panel. A thickness $t_2$ of the back-surface plate is set to a value equal to or larger than a thickness $t_A$ that is calculated by Equation (1) and equal to or smaller than a thickness $t_B$ that is calculated by Equation (2):

$$t_A = \sqrt{\frac{E_1}{E_2}t_1^2 + t_3^2} - t_3 \quad (1)$$

$$t_B = \sqrt{\frac{E_1}{E_2}t_1(t_1 + 2t_3)} \quad (2)$$

where $E_1$ is a modulus of elasticity of the surface protection member, $t_1$ is a thickness of the surface protection member, $E_2$ is a modulus of elasticity of the back-surface plate, and $t_3$ is a thickness of the cell protection member.

Effect of the Invention

According to the present invention, it is possible to provide a highly reliable solar cell module in which the power generation efficiency does not degrade when it is installed outdoors.

EXPLANATIONS OF LETTERS OR NUMERALS

| | |
|---|---|
| 1, 21, 31 | solar panel |
| 2 | solar cell |
| 3 | surface protection member |
| 4 | cell protection member |
| 5, 25, 35 | solar cell module |
| 6 | brace |
| 6a | screw |
| 6b | end face |

-continued

| | |
|---|---|
| 7 | outer frame |
| 7a | corner |
| 7b | inclined member |
| 7c | inner end surface |
| 7e | groove |
| 8 | supporting member |
| 8a | supporting block |
| 8b | intersection groove |
| 8c | supporting plate |
| 9 | initial gap |
| 10 | nut |
| 12 | center area of solar panel |
| 14 | back-surface plate (sandwich-structured panel) |
| 15 | distribution of deformation |
| 16 | neutral axis |
| 18 | coat plate |
| 19 | core material |

BEST MODE(S) FOR CARRYING OUT THE INVENTION

Exemplary embodiments of a solar cell module according to the present invention are described in detail below with reference to the accompanying drawings. The present invention is not limited to these exemplary embodiments.

First Embodiment

Figure 1:
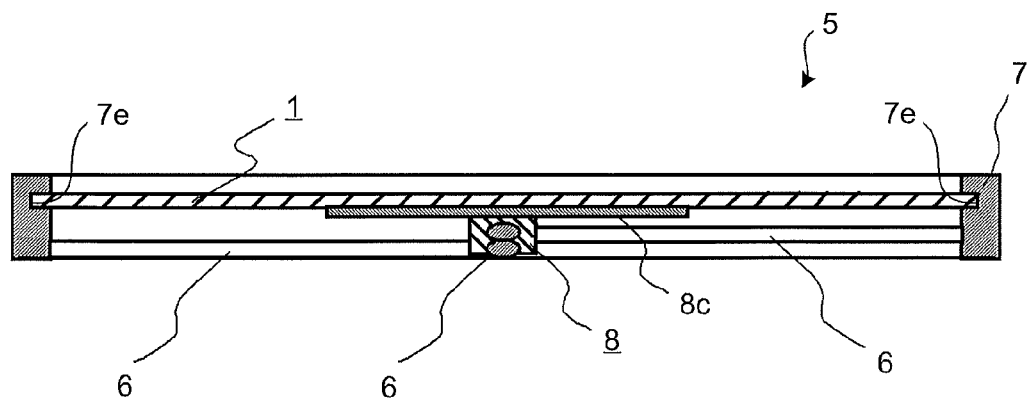
FIG. 1 is a longitudinal cross-sectional view of a solar cell module according to a first embodiment of the present invention.
Figure 2:
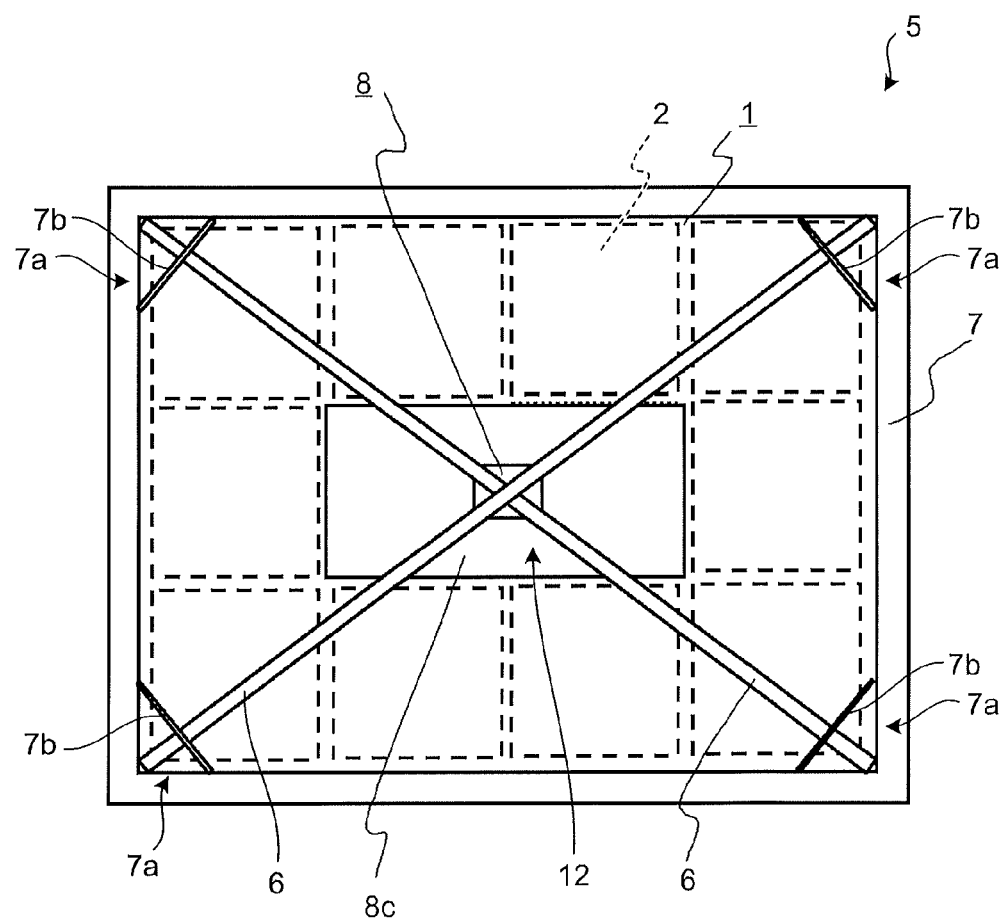
FIG. 2 is a bottom view of the solar cell module according to the first embodiment.
Figure 3:
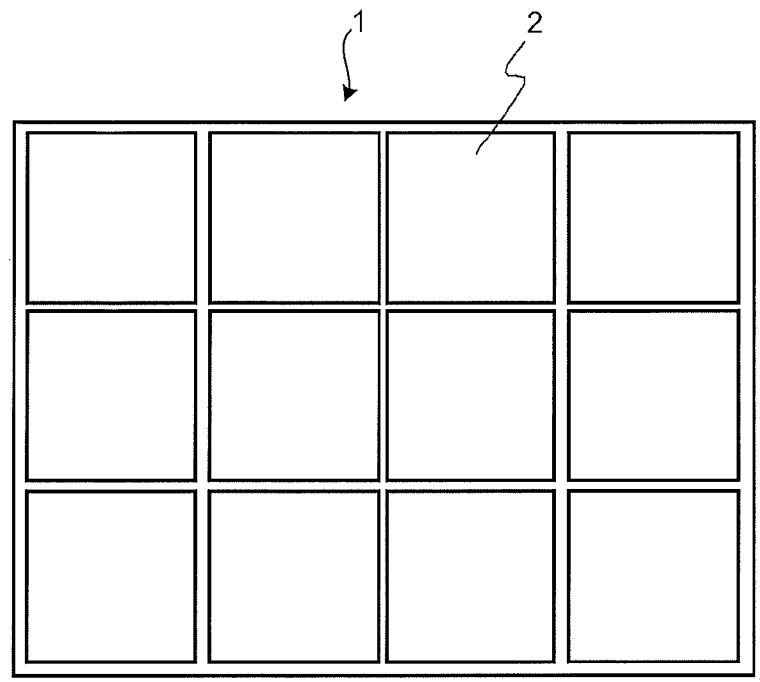
FIG. 3 is a top view of a solar panel that is provided to the solar cell module according to the first embodiment.
Figure 4:
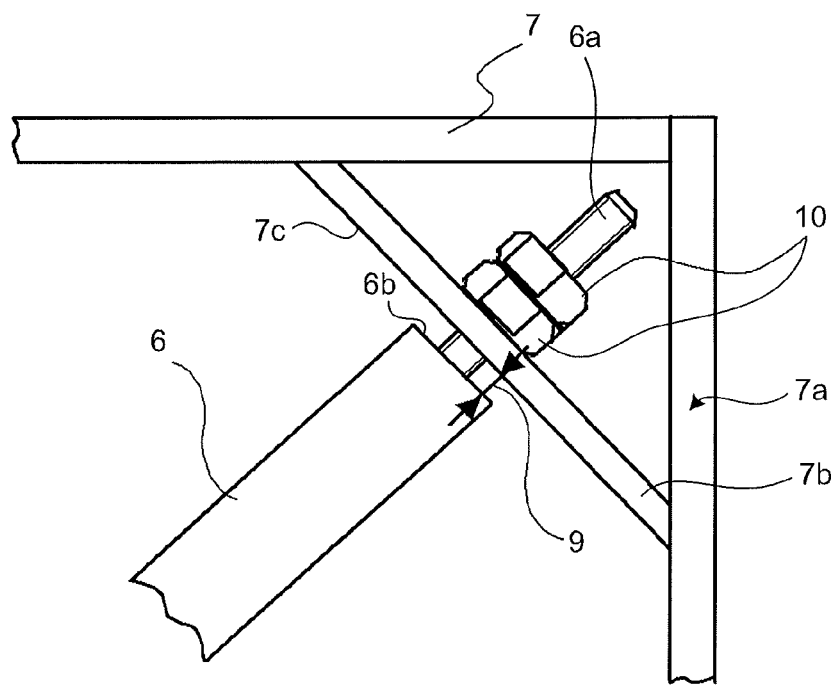
FIG. 4 is a partial bottom view of a joint part at which an outer frame and a brace of the solar cell module according to the first embodiment are joined together.
Figure 5:
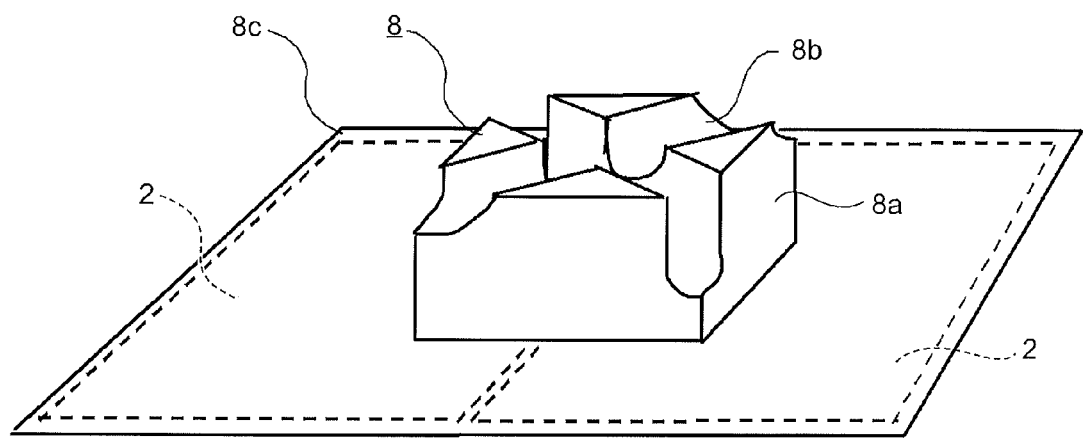
FIG. 5 is a perspective view of a supporting member of the solar cell module according to the first embodiment.

FIG. 1 is a longitudinal cross-sectional view of a solar cell module according to a first embodiment of the present invention; FIG. 2 is a bottom view of the solar cell module according to the first embodiment; FIG. 3 is a top view of a solar panel that is provided to the solar cell module according to the first embodiment; FIG. 4 is a partial bottom view of a joint part at which an outer frame and a brace of the solar cell module according to the first embodiment are joined together; FIG. 5 is a perspective view of a supporting member of the solar cell module according to the first embodiment; and FIG. 6 is a longitudinal cross-sectional view of a part of the solar panel that is provided to the solar cell module according to the first embodiment.

As illustrated in FIG. 1 to FIG. 5, a solar cell module 5 according to the first embodiment includes a rectangular plate-shaped solar panel 1 including a plurality of solar cells 2 (twelve in the first embodiment), each cell being a rectangular plate, that is arranged on the same plane spaced with each other; a rectangular outer frame 7 that is made of aluminum alloy and that supports the solar panel 1 with a circumference of the solar panel 1 being inserted to a groove 7e; and two braces 6, 6 that are made of high-tensile steel that are arranged on a back surface of the solar panel 1 along two diagonals of the outer frame 7 fixed by inclined members 7b that are arranged on corners 7a of the outer frame 7.

The two braces 6, 6 intersect with each other on a center area 12 of the outer frame 7 and the solar panel 1. A supporting member 8 that is made of aluminum alloy is arranged on the intersection of the braces 6, 6. The center area 12 on the back surface of the solar panel 1 is supported by a rectangular supporting plate 8c of the supporting member 8.

Figure 6:
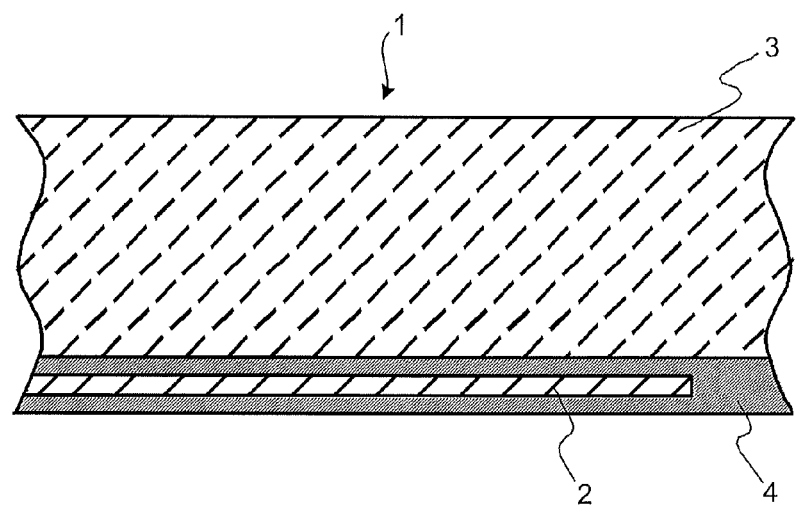
FIG. 6 is a longitudinal cross-sectional view of a part of the solar panel that is provided to the solar cell module according to the first embodiment.

As illustrated in FIG. 6, the solar cells 2 (although only one of the solar cells 2 is illustrated in FIG. 6, all the twelve solar cells 2 are arranged on the same plane with a certain space therebetween) are coated with a cell protection member 4 that is made of flexible resin, such as EVA (ethylene-vinyl acetate copolymer). A surface protection member 3 is bonded onto the top surface of the cell protection member 4 that is shaped into a plate to cover the twelve solar cells 2.

The surface protection member 3 is a tempered glass plate of thickness from 2 mm to 4 mm. The solar cells 2 are made of crystal silicon of thickness from 0.1 mm to 0.4 mm. The cell protection member 4 including the solar cells 2 is from 0.3 mm to 1 mm thick.

In the conventional solar cell module, when a large external force (bending load) is applied to the solar panel, such as a bending load that is applied during transportation, a bending load that is applied when a worker rides on the solar panel during operation for installation on a house roof, and a force that is applied by strong wind to the surface after installation, the solar panel is deformed and thereby the solar cells 2 sealed inside may crack. When the solar panel receives such an external force exceeding an allowable limit, the cracks appearing in the solar cells 2 degrade the power generation efficiency of the solar cells 2.

In the solar cell module 5 according to the first embodiment, to prevent generation of the cracks due to the deformation of the solar panel 1, the center area on the back surface of the solar panel 1 is supported by the braces 6, 6 and the supporting member 8.

The two braces 6, 6 are arranged along the two diagonals of the outer frame 7 that supports the circumference of the solar panel 1. Both ends of each brace 6 are joined to the two inclined members 7b, 7b that are arranged on the two opposed corners 7a, 7a of the outer frame 7. The two braces 6, 6 intersect with each other on the center area 12. The center area on the back surface of the solar panel 1 is supported by the rectangular supporting plate 8c of the supporting member 8 that is made of aluminum alloy and arranged on the intersection of the braces 6, 6.

Even when the solar panel 1 is subjected to a bending load, because the center area on the back surface of the solar panel 1 is supported by the braces 6, 6, a degree of the bending deformation of the solar panel 1 is suppressed. Therefore, even if the various loads, such as the load during transportation, the load during installation, and the load by wind after installation, are applied to the solar cell module 5, the solar cells 2 scarcely crack.

Because of this, the power generation efficiency is prevented from degrading after the installation of the solar cell module 5, which improves the reliability. Moreover, because the braces 6, 6, which are rod shaped, strengthen the solar panel 1 without much covering the back surface of the solar panel 1, a heat dissipation efficiency from the back surface of the solar panel 1 is maintained high. Therefore, no degradation in the power generation efficiency because of an increase in the temperature of the solar cells 2 takes place.

As illustrated in FIG. 4, a screw 6a is formed at the both ends of the rod-shaped brace 6. The inclined member 7b is fixed to the corner 7a of the outer frame 7. The inclined member 7b is provided with a through hole, and the screw 6a is inserted into the through hole. The both ends of the brace 6 are fixed to the two opposed corners 7a, 7a of the outer frame 7, respectively with nuts 10, 10 that are screwed into the screw 6a.

An initial gap 9 is provided between an end face 6b of the brace 6 inside of the screw 6a and an inner end surface 7c of the inclined member 7b. When the nuts 10, 10 are tightened up, an initial tension T is provided to the brace 6. When the brace 6 is subjected to the initial tension T, if the solar panel 1 is bent and deformed, not only a natural restoring force against bending of the brace but also a restoring force F represented by Equation $F=2Tx/L$ in which L is length of the brace 6 and x is amount of the bending deformation is exerted.

The restoring force exerted to the brace 6 that is subjected to the initial tension T is large compared with that exerted to the brace 6 that is not subjected to the initial tension T, i.e., the rigidity of the braces 6, 6 against the bending deformation of the solar panel 1 becomes large. Moreover, smaller braces 6, 6 can be used compared to when the braces 6, 6 are not subjected to the initial tension. Smaller braces 6, 6 are advantageous because they have a smaller mass.

Furthermore, it is allowable to form the brace 6 by joining separated two parts together with a turnbuckle and provide the initial tension T by the turnbuckle. The brace 6, which is used to join the solar panel 1 to the outer frame 7 that supports the solar panel 1, can be used, although not shown, as a frame member to attach the outer frame 7 to the installation place.

As illustrated in FIG. 5, the supporting member 8, which is arranged at the intersection of the braces 6, 6, includes a supporting block 8a having an intersection groove 8b with which the intersecting braces 6, 6 are engaged; and the supporting plate 8c that is fixed to a surface of the supporting block 8a close to the solar panel 1 in such a manner that its circumference is aligned with a circumference of a pair of the solar cells 2, 2 that is arranged on the center area.

When the supporting plate 8c configured as above, as illustrated in FIG. 2 and FIG. 5, a concentrated load that is generated near the circumference of the supporting plate 8c is exerted to not the solar cells 2 but a gap between the solar cells 2, 2. Therefore, the solar cells 2 do not crack easily. Although the supporting plate 8c is arranged in such a manner that its circumference is aligned with the circumference of the pair of the solar cells 2, 2 in the first embodiment, some other arrangement is allowable as long as the circumference of the supporting plate 8c is aligned with the gap between the solar cells 2, 2. The supporting plate 8c can be of the size of one solar cell 2 or of the size of two or more solar cells 2.

Although the surface protection member 3 is made of tempered glass in the first embodiment, the surface protection member 3 can be made of some other transparent material, such as transparent resin. Moreover, although the two braces 6 are arranged along the diagonals of the solar panel 1, the arrangement is not limited thereto. Any arrangement is allowable if the brace crosses over the center area of the solar panel 1.

Second Embodiment

Figure 7:
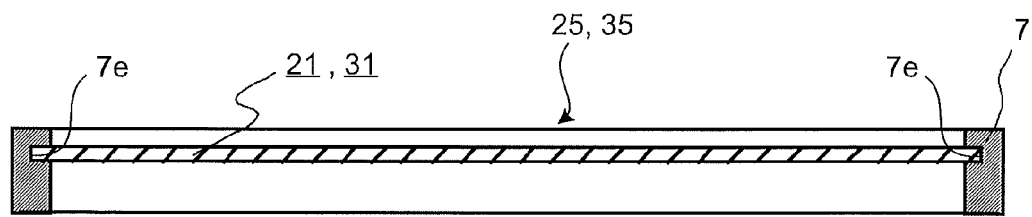
FIG. 7 is a longitudinal cross-sectional view of a solar cell module according to a second embodiment and a third embodiment of the present invention.
Figure 8:
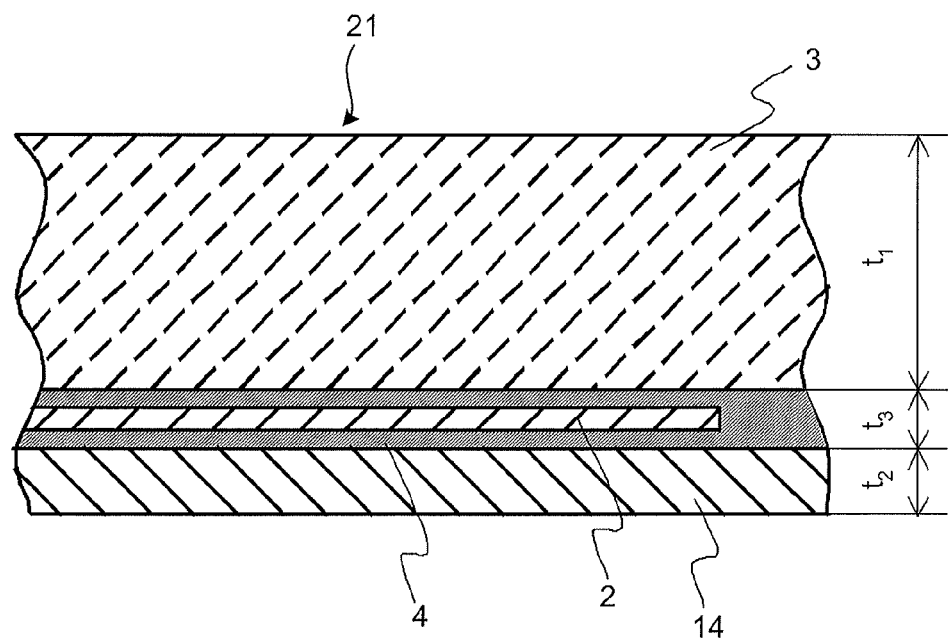
FIG. 8 is a longitudinal cross-sectional view of a part of a solar panel that is provided to the solar cell module according to the second embodiment.

FIG. 7 is a longitudinal cross-sectional view of a solar cell module according to a second embodiment and a third embodiment of the present invention; and FIG. 8 is a longitudinal cross-sectional view of a part of a solar panel that is provided to the solar cell module according to the second embodiment.

As illustrated in FIG. 7 and FIG. 8, a solar cell module 25 according to the second embodiment includes a rectangular plate-shaped solar panel 21 on which the plural rectangular solar cells 2 are arranged; and the rectangular outer frame 7 that is made of aluminum alloy and that supports the solar panel 21. A circumference of the solar panel 21 is inserted into the groove 7e in the outer frame 7.

As illustrated in FIG. 8, in the solar panel 21, the solar cells 2 (although only one solar cell 2 is illustrated in FIG. 8, the plural solar cells 2 are arranged on the same plane with a certain space therebetween) are coated with the cell protection member 4 that is made of flexible resin, such as EVA. The plate-shaped surface protection member 3 that is made of tempered glass is bonded onto the top surface of the plate-shaped cell protection member 4. A back-surface plate 14 is bonded onto the back surface of the cell protection member 4 of the solar panel 21.

In the conventional solar cell module, an allowable curvature of the individual solar cell is much larger than that of the tempered glass forming the surface protection member, moreover, the solar cells are bonded to the surface protection member; therefore, the solar cells cannot deform to an extend exceeding the allowable curvature. The solar cells crack, nevertheless, when receiving the load during transportation, the load during installation, or the load by wind for the following reason.

Figure 9:
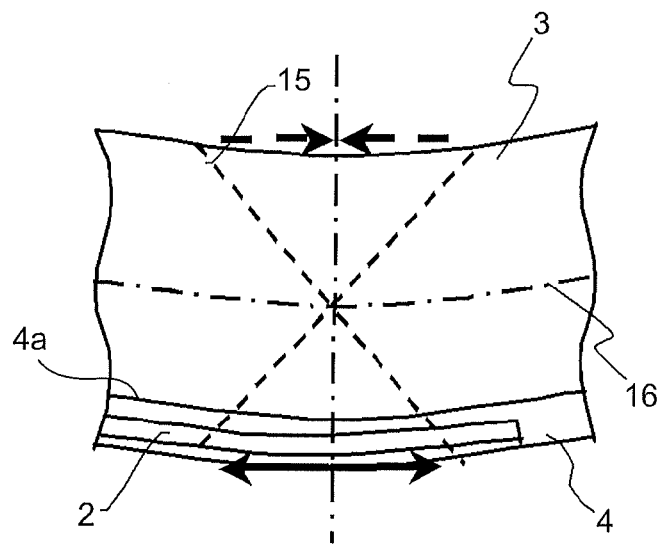
FIG. 9 is a diagram for explaining a state of deformation that occurs in a conventional solar panel.

FIG. 9 is a diagram for explaining a state of the deformation that occurs in the conventional solar panel when the solar panel is bent and deformed by the load during transportation, the load during installation, or the load by wind. Broken lines 15 represent a distribution of magnitude of compression deformation and tension deformation ranging from a neutral axis 16 to the surface layer of the solar panel.

As illustrated in FIG. 9, when the surface of the conventional solar panel is subjected to a large force in a direction from the top to the bottom of FIG. 9 during transportation, during installation, or after installation by wind, the conventional solar panel bends downward. Although the solar panel is the panel that is formed by bonding the surface protection member 3 and the cell protection member 4 together, an adhesive layer 4a hardly allows sliding; therefore, the solar panel is bent and deformed in the same manner as if it were a homogeneous component.

The degree of the deformation on the solar panel increases linearly, with an increase in the distance in upward or downward direction from the neutral axis 16. The compression deformation occurs in a region that is above the neutral axis 16 as indicated with a broken arrow illustrated in FIG. 9; and the tension deformation occurs in a region that is below the neutral axis 16 as illustrated with a continuous arrow.

Because the conventional solar panel is formed by bonding the tempered-glass surface protection member 3 of thickness from 2 mm to 4 mm and the crystal-silicon solar cells 2 of thickness from 0.1 mm to 0.4 mm together, the solar cells 2 that are from the neutral axis 16 are subjected to a relatively larger tension deformation. As a result, even when the curvature is within the allowable curvature of the individual solar cells 2, the solar cells 2 crack.

As illustrated in FIG. 8, in the solar panel 21 according to the second embodiment, the solar cells 2 are arranged closer to the neutral axis by bonding the back-surface plate 14 of a predetermine thickness to the back surface of the cell protection member 4 so that the solar cells 2 are subjected to a relatively smaller tension deformation, which suppresses generation of the cracks.

Because of this, even when the solar cell module 25 is subjected to a load during transportation, during installation, or after installation by wind, the solar cells 2 are unlikely to crack, and thus degradation in the power generation efficiency after the installation of the solar cell module 25 is prevented.

Specifically, if the neutral axis 16 (not illustrated in FIG. 8) is positioned within the thickness of the cell protection member 4, the deformation on the solar cells 2 becomes further small. Therefore, even when the solar panel 21 is subjected to a large bending load, the damage on the solar cells 2 by the cracks is prevented.

To set the neutral axis 16 within the thickness of the cell protection member 4, it is required to set a thickness $t_2$ of the back-surface plate 14 equal to or larger than a thickness $t_A$ that is calculated by Equation (1) and equal to or smaller than a thickness $t_B$ that is calculated by Equation (2) ($t_A \leq t_2 \leq t_B$) in which Equations (1) and (2) are induced by an equation for representing a position of the neutral axis of combined braces ("material mechanics in mechanical science" published by Yokendo, 2001, page 179):

$$t_A = \sqrt{\frac{E_1}{E_2}t_1^2 + t_3^2} - t_3 \quad (1)$$

$$t_B = \sqrt{\frac{E_1}{E_2}t_1(t_1 + 2t_3)} \quad (2)$$

where $E_1$ is modulus of elasticity of the surface protection member 3, $t_1$ is a plate thickness of the surface protection member 3, $E_2$ is modulus of elasticity of the back-surface plate 14, $t_2$ is a plate thickness of the back-surface plate 14, and $t_3$ is thickness of the cell protection member 4 around the solar cells 2.

As described hereinabove, in the solar cell module 25 according to the second embodiment, the back-surface plate 14 is bonded onto the back surface of the cell protection member 4 of the solar panel 21, and the thickness $t_2$ of the back-surface plate 14 is set to be equal to or larger than the thickness $t_A$, which is calculated by Equation (1), and equal to or smaller than the thickness $t_B$, which is calculated by Equation (2), using the modulus of elasticity $E_1$ and the thickness $t_1$ of the surface protection member 3, the modulus of elasticity $E_2$ of the back-surface plate 14, and the thickness $t_3$ of the cell protection member 4. Accordingly, generation of the cracks in the solar cells 2 decreases remarkably, and the degradation in the power generation efficiency after the installation of the solar cell module 25 is prevented, which improves the reliability.

Moreover, because the bending deformation is permitted to the extent to the allowable curvature of the individual solar cells 2, and it is possible to decrease the rigidity of the surface protection member 3 by the presence of the back-surface plate 14, it is possible to decrease the thickness of the surface protection member 3 and reduce the mass of the solar panel 21.

If the back-surface plate 14 is made of metal having a high heat conductivity, such as copper, more heat is dissipated from the back surface of the solar panel 21 so that an increase in the temperature of the solar cells 2 is suppressed, which improves the power generation efficiency of the solar cell module 25.

Third Embodiment

Figure 10:
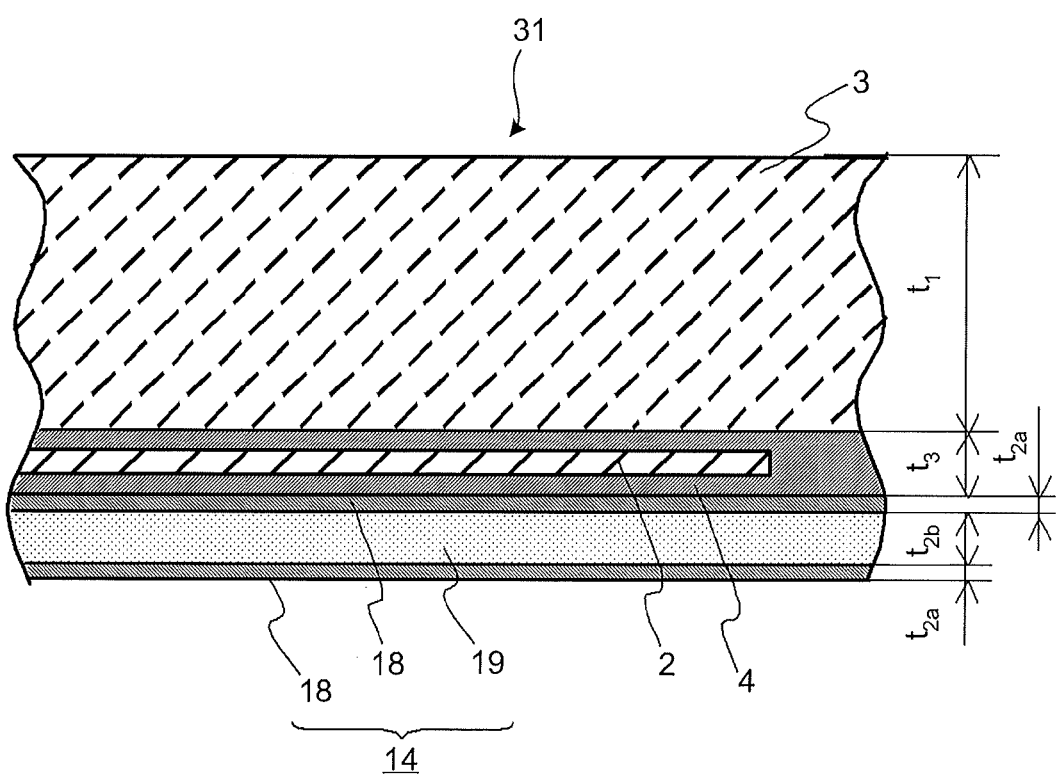
FIG. 10 is a longitudinal cross-sectional view of a part of a solar panel that is provided to the solar cell module according to the third embodiment of the present invention.

FIG. 10 is a longitudinal cross-sectional view of a part of a solar panel that is provided to the solar cell module according to the third embodiment of the present invention.

As illustrated in FIG. 10, in a solar panel 31 according to the third embodiment, top and back surfaces of the solar cells 2 are coated with the flexible cell protection member 4, the surface protection member 3 is bonded onto the top surface of the flexible cell protection member 4, and a sandwich-structured panel 14 that functions as the back-surface plate 14 is bonded onto the back surface of the flexible cell protection member 4. In the sandwich-structured panel 14, a plate-shaped core material 19 is sandwiched between coat plates 18. A solar cell module 35 according to the third embodiment has the configuration the same as the solar cell module 25 illustrated in FIG. 7 has.

The sandwich-structured panel 14, which is represented by a honeycomb panel, has an extremely high rigidity against bending. When the sandwich-structured panel 14 is bonded to the back surface of the solar panel 31 as the back-surface plate 14, the damage on the solar cells 2 by the cracks is prevented.

Specifically, if the neutral axis 16 (not illustrated in FIG. 10) is positioned within the thickness of the cell protection member 4, the tension deformation that occurs in the solar cells 2 becomes small, and therefore the damage of the solar cells 2 is prevented even when the solar panel 31 is bent and deformed largely. Thus, the reliability of the solar cell module 35 (see FIG. 7) improves.

When employing the sandwich-structured panel 14, to set the neutral axis 16 within the thickness of the cell protection member 4, Equation (1) and Equation (2), which take into consideration a single material, cannot be used as they are because the sandwich-structured panel 14 is layered structure made of plural materials.

When the three-layered sandwich-structured panel 14 illustrated in FIG. 10 is used, to set the neutral axis 16 within the thickness of the cell protection member 4, it is required to set the thickness $t_2$ of the sandwich-structured panel 14 to a value calculated by Equation (3), the modulus of elasticity $E_2$ to a value calculated by Equation (4) so that the thickness $t_2$ of the sandwich-structured panel 14 that is calculated by Equation (3) is equal to or larger than the thickness $t_A$ that is calculated by Equation (1) and equal to or smaller than the thickness $t_3$ that is calculated by Equation (2) ($t_A \leq t_2 \leq t_B$):

$$t_2 = 2t_{2a} + t_{2b} \quad (3)$$

$$E_2 = E_{2a}\frac{2t_{2a}}{2t_{2a} + t_{2b}} \quad (4)$$

where $t_{2a}$ is thickness of the coat plate 18, $E_{2a}$ is modulus of elasticity of the coat plate 18, and $t_{2b}$ is thickness of the core material 19.

As described above, in the solar cell module 35 according to the third embodiment, the sandwich-structured panel including the core material 19 sandwiched between the coat plates 18 is used as the back-surface plate 14 that is bonded to the back surface of the cell protection member 4. The thickness $t_2$ of the sandwich-structured panel 14 is calculated by Equation (3), the modulus of elasticity $E_2$ is calculated by Equation (4), and the thickness $t_2$ of the sandwich-structured panel 14 is set to be equal to or larger than the thickness $t_A$ that is calculated by Equation (1) and equal to or smaller than the thickness $t_B$ that is calculated by Equation (2). With this configuration, generation of the cracks in the solar cells 2 decreases remarkably and the degradation in the power generation efficiency after the installation of the solar cell module 35 is suppressed, as a result of which the reliability improves.

Moreover, in the third embodiment, because the sandwich-structured panel is used as the back-surface plate 14, it is possible to reduce the mass of the solar cell module 35. Furthermore, if a honeycomb layer made of metal, such as aluminum, is used as the core material honeycomb layer, the heat conductivity can be improved as compared to a case where a heat insulator is used; therefore, the increase in the temperature of the solar cells 2 is suppressed, which improves the power generation efficiency of the solar cell module 35.

If the coat plate 18 is made of metal, such as aluminum, the heat conductivity becomes high; therefore, the increase in the temperature of the solar cells 2 is suppressed, which improves the power generation efficiency of the solar cell module 35. The coat plate 18 can be made of FRP (Fiber Reinforced Plastics). If so, the mass of the solar panel 31 becomes less as compared with a case where metal, such as aluminum, is used.

INDUSTRIAL APPLICABILITY

As set forth hereinabove, a solar cell module according to the present invention is useful as a solar cell module that is tolerant to a load during transportation, during installation, or in strong winds.

The invention claimed is:

1. A solar cell module comprising:
a plate-shaped solar panel including a plurality of solar cells arranged on a same plane;
a plate-shaped cell protection member that covers the plural solar cells that are arranged on the same plane;
a surface protection member that is bonded onto a top surface of the cell protection member;
an outer frame that supports a circumference of the solar panel;
a first brace having rigidity against bending and that supports a center area of a back surface of the solar panel in such a manner that both ends of the first brace are joined to each of two opposed positions of the outer frame; and
a second brace having rigidity against bending and that supports the center area of the back surface of the solar panel in such a manner that both ends of the second brace are joined to two other opposed positions of the outer frame wherein the first brace and the second brace intersect with each other in the center area; and
an initial tension is provided to the braces.

2. The solar cell module according to claim 1, further comprising:
a supporting member that is arranged on the braces and that supports a solar cell portion arranged on the center area on the back surface of the solar panel, wherein the supporting member includes a supporting plate that is formed in such a manner that a circumference of the supporting plate is arranged in a gap between the plural solar cells.

3. The solar cell module according to claim 2, wherein the supporting member comprises:
intersecting grooves for receiving intersecting portions of the first and the second brace.

4. The solar cell module according to claim 1, comprising:
a tensioner arranged at least one of the braces for adjusting the tension of at least one brace.

5. A solar cell module comprising:
a plate-shaped solar panel including a plurality of solar cells arranged on a same plane;
a plate-shaped cell protection member that covers the plurality of solar cells that are arranged on the same plane;
a surface protection member that is bonded onto a top surface of the plate-shaped cell protection member;
a back-surface plate that is bonded onto a back surface of the plate-shaped cell protection member; and
an outer frame that supports a circumference of the solar panel, wherein a thickness of the back-surface plate is determined so that a neutral axis of a bending deformation for the solar cell module is located within a thickness of the plate-shaped cell protection member.

6. The solar cell module according to claim 5, wherein a thickness $t_2$ of the back-surface plate is set to a value equal to or larger than a thickness $t_A$ that is calculated by Equation (1) and equal to or smaller than a thickness $t_B$ that is calculated by Equation (2):

$$t_A = \sqrt{\frac{E_1}{E_2}t_1^2 + t_3^2} - t_3 \quad (1)$$

$$t_B = \sqrt{\frac{E_1}{E_2}t_1(t_1 + 2t_3)} \quad (2)$$

where $E_1$ is a modulus of elasticity of the surface protection member, $t_1$ is a thickness of the surface protection member, $E_2$ is a modulus of elasticity of the back-surface plate, and $t_3$ is a thickness of the plate-shaped cell protection member.

7. The solar cell module according to claim 5, wherein the back-surface plate is a sandwich-structured panel in which a core material is sandwiches between two coat plates, and
a thickness $t_2$ is set to a value that is calculated by Equation (3), and the modulus of elasticity $E_2$ of the sandwich-structured panel is set to a value that is calculated by Equation (4):

$$t_2 = 2t_{2a} + t_{2b} \quad (3)$$

$$E_2 = E_{2a}\frac{2t_{2a}}{2t_{2a} + t_{2b}} \quad (4)$$

where $E_{2a}$ is a modulus of elasticity of the coat plate, $t_{2a}$ is a thickness of the coat plate, and $t_{2b}$ is a thickness of the core material.

* * * * *